United States Patent
Meng et al.

(10) Patent No.: US 11,276,674 B2
(45) Date of Patent: Mar. 15, 2022

(54) DRIVING SUBSTRATE AND MANUFACTURING METHOD THEREOF, AND DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Ke Meng, Beijing (CN); Chao Liu, Beijing (CN); Qiangwei Cui, Beijing (CN); Chuhang Wang, Beijing (CN); Lili Wang, Beijing (CN); Linhui Gong, Beijing (CN); Yutian Chu, Beijing (CN); Fan Yang, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 40 days.

(21) Appl. No.: 16/862,934

(22) Filed: Apr. 30, 2020

(65) Prior Publication Data
US 2021/0167045 A1    Jun. 3, 2021

(30) Foreign Application Priority Data
Nov. 29, 2019    (CN) .......................... 201911205786.X

(51) Int. Cl.
*H01L 27/118*    (2006.01)
*H01L 25/075*    (2006.01)
(Continued)

(52) U.S. Cl.
CPC ........ *H01L 25/0753* (2013.01); *H01L 27/124* (2013.01); *H01L 33/62* (2013.01)

(58) Field of Classification Search
CPC .... H01L 25/0753; H01L 27/124; H01L 33/62
(Continued)

(56) References Cited

U.S. PATENT DOCUMENTS

| 2017/0242508 A1* | 8/2017 | Wu ..................... G06F 3/04164 |
| 2019/0196632 A1 | 6/2019 | Ryu et al. |
| 2020/0029439 A1 | 1/2020 | Zhang et al. |

FOREIGN PATENT DOCUMENTS

| CN | 102122463 A | 7/2011 |
| CN | 104678625 A | 6/2015 |

(Continued)

OTHER PUBLICATIONS

Second Office Action issued in corresponding Chinese Patent Application No. 201911205786.X, dated Apr. 14, 2021; with English translation.
(Continued)

*Primary Examiner* — Tan N Tran
(74) *Attorney, Agent, or Firm* — McDermott Will & Emery LLP

(57) ABSTRACT

A driving substrate includes a base substrate. The base substrate has a display region and a peripheral region, and the peripheral region includes a bonding region between the display region and a first side face of the base substrate. The driving substrate further includes a plurality of first pads spaced apart from each other, which are disposed in the bonding region of the base substrate. A first side face of each first pad is flush with the first side face of the base substrate. A thickness of the first pad is approximately in a range from 0.5 microns to 2 microns.

11 Claims, 4 Drawing Sheets

(51) Int. Cl.
  *H01L 27/12* (2006.01)
  *H01L 33/62* (2010.01)
(58) Field of Classification Search
  USPC .......................................... 257/203, 207, 208
  See application file for complete search history.

(56) References Cited

FOREIGN PATENT DOCUMENTS

| | | |
|---|---|---|
| CN | 107422553 A | 12/2017 |
| CN | 109426018 A | 3/2019 |
| CN | 109659304 A | 4/2019 |

OTHER PUBLICATIONS

Notification of the First Office Action issued in Chinese Patent Application No. 201911205786.X, dated Dec. 10, 2020; with English translation.

\* cited by examiner

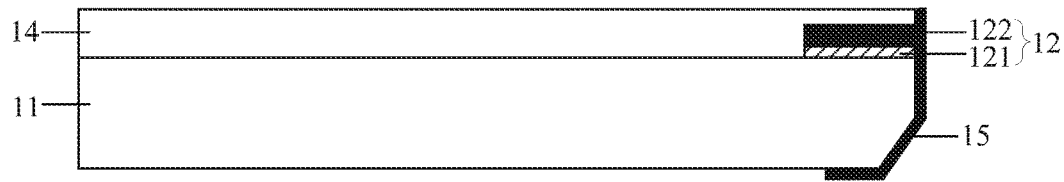

FIG. 4

```
┌─────────────────────────────────────────────┐
│ A plurality of first pads spaced apart from    │  S1
│ each other are formed in the bonding region    │
│ on the base layer. The thickness of the first  │
│ pad is in a range from approximately           │
│ 0.5 microns to approximately 2 microns.        │
└─────────────────────────────────────────────┘
                       │
                       ▼
┌─────────────────────────────────────────────┐
│ A first side of the driving substrate is       │  S2
│ edge-grinded, so that the first side face of   │
│ each first pad is flush with the first side    │
│ face of the base layer.                        │
└─────────────────────────────────────────────┘
```

FIG. 5

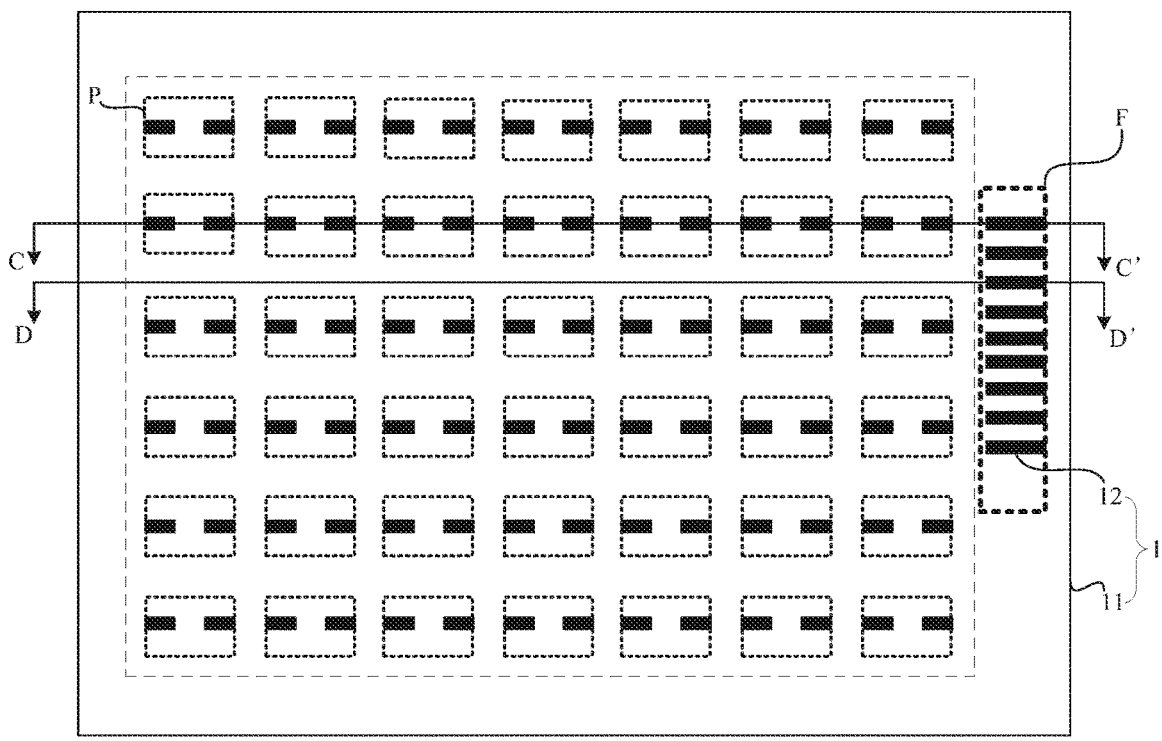

FIG. 6

DRIVING SUBSTRATE AND MANUFACTURING METHOD THEREOF, AND DISPLAY DEVICE

CROSS-REFERENCE TO RELATED APPLICATION

This application claims priority and the benefit to Chinese Patent Application No. 201911205786.X filed Nov. 29, 2019, which is incorporated herein by reference in its entirety.

TECHNICAL FIELD

The present disclosure relates to the field of display technologies, and in particular, to a driving substrate and a manufacturing method thereof, and a display device.

BACKGROUND

Light-emitting diode display devices with micro light-emitting diodes (Micro-LEDs) have characteristics such as independent image control, independent light-emitting control, high brightness, low power consumption, ultra-high resolution and high chroma, and have become one of the hot topics in the development of display technologies in the future.

SUMMARY

In one aspect, some embodiments of the present disclosure provide a driving substrate. The driving substrate includes a base substrate. The base substrate has a display region and a peripheral region, and the peripheral region includes a bonding region disposed between the display region and a first side face of the base substrate. The driving substrate further includes a plurality of first pads spaced apart from each other in the bonding region on the base substrate. A first side face of each first pad is flush with the first side face of the base substrate, and a thickness of the first pad is in a range from approximately 0.5 microns to approximately 2 microns.

In some embodiments, the driving substrate further includes a plurality of second pads disposed in the display region of the base substrate. At least one second pad of plurality of second pads includes a first sub-layer and a second sub-layer that are stacked in a direction away from the base substrate, and a material of the second sub-layer is solder.

In some embodiments, at least one first pad of the plurality of first pads includes a third sub-layer and a fourth sub-layer that are stacked. The third sub-layer and the first sub-layer are disposed in a same layer, and the fourth sub-layer and the second sub-layer are disposed in a same layer.

In some embodiments, the driving substrate further includes a protective adhesive layer disposed at a side of the plurality of first pads and the plurality of second pads away from the base substrate. The protective adhesive layer includes via holes each for exposing a surface of a respective one of the plurality of first pads facing away from the base substrate. A side face of the protective adhesive layer is flush with the first side face of the base substrate. A hardness of the protective adhesive layer is in a range from approximately 70 Shore D to approximately 90 Shore D.

In some embodiments, the driving substrate further includes a side trace disposed on and in contact with both the first side face of the first pad and the first side face of the base substrate.

In some embodiments, a vertex angle between the first side face of the base substrate and a surface of the base substrate facing away from the first pad is a chamfer.

In another aspect, some embodiments of the present disclosure provide a display device. The display device includes the driving substrate as described above, and a plurality of light-emitting diodes disposed in the display region of the driving substrate.

In yet another aspect, some embodiments of the present disclosure provide a manufacturing method of the driving substrate described in the above embodiments. The manufacturing method includes: forming the plurality of first pads spaced apart from each other in the bonding region on the base substrate, wherein the thickness of the first pad is in the range from approximately 0.5 microns to approximately 2 microns; and edge-grinding a side of the driving substrate formed with the plurality of first pads so that a first side face of each first pad is flush with the first side face of the base substrate.

In some embodiments, the manufacturing method further includes: forming a plurality of second pads in the display region on the base substrate.

In some embodiments, forming the plurality of first pads and the plurality of second pads, includes: forming first sub-layers of the plurality of second pads and third sub-layers of the plurality of first pads by a first patterning process; and forming second sub-layers of the plurality of second pads and fourth sub-layers of the plurality of first pads by a second patterning process.

In some embodiments, the manufacturing method further includes: forming a protective adhesive layer disposed at a side of the plurality of first pads and the plurality of second pads away from the base substrate. The protective adhesive layer includes via holes each for exposing a surface of a respective one of the plurality of second pads facing away from the base substrate, and a hardness of the protective adhesive layer is in a range from approximately 70 Shore D to approximately 90 Shore D.

In some embodiments, the manufacturing method further includes: forming a side trace both on the first side face of the base substrate and the side face of the first pad by a transfer printing process.

In some embodiments, before forming a side trace on both the first side face of the base substrate and the side face of the first pad by a transfer printing process, the manufacturing method further includes: chamfering a vertex angle between the first side face of the base substrate and a surface of the base substrate facing away from the first pad.

BRIEF DESCRIPTION OF THE DRAWINGS

In order to describe technical solutions in embodiments of the present disclosure more clearly, the accompanying drawings to be used in the description of embodiments will be introduced briefly. Obviously, the accompanying drawings to be described below are merely some embodiments of the present disclosure, and for a person of ordinary skill in the art, other drawings may be obtained according to these drawings without paying any creative effort.

FIG. 4 is a schematic diagram of a structure in which a side trace is formed on the light-emitting diode display device shown in FIG. 3, in accordance with some embodiments;

FIG. 5 is a schematic flow chart of a manufacturing method of a driving substrate, in accordance with some embodiments;

FIG. 6 is a schematic top view of a driving substrate, in accordance with some embodiments;

DETAILED DESCRIPTION

Figure 1:
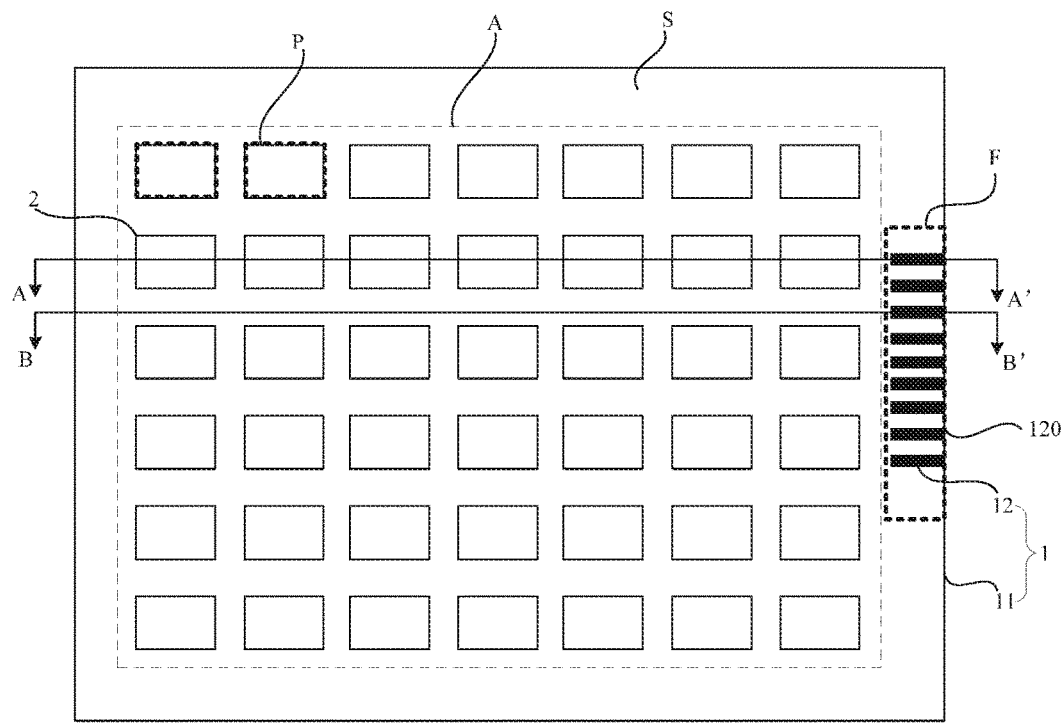
FIG. 1 is a schematic top view of a light-emitting diode display device, in accordance with some embodiments.

The technical solutions in embodiments of the present disclosure will be described clearly and completely with reference to the accompanying drawings in the embodiments of the present disclosure. Obviously, the described embodiments are merely some but not all of embodiments of the present disclosure. All other embodiments obtained based on the embodiments of the present disclosure by a person of ordinary skill in the art without paying any creative effort shall be included in the protection scope of the present disclosure.

In the description of embodiments of the present disclosure, it will be understood that orientations or positional relationships indicated by terms "center", "upper", "lower", "front", "rear", "left", "right", "vertical", "horizontal", "top", "bottom", "inner", "outer", etc. are based on orientations or positional relationships shown in the drawings, which is merely to facilitate and simplify the description of embodiments of the present disclosure, and is not to indicate or imply that the referred devices or elements must have a particular orientation, or must be constructed or operated in a particular orientation. Therefore, they should not be construed as limitations to the present disclosure. In the description of the embodiments of the present disclosure, the term "a/the plurality of" means two or more unless otherwise specified.

Unless the context requires otherwise, the term "comprise" and other forms thereof such as the third-person singular form "comprises" and the present participle form "comprising" in the specification and the claims are construed as an open and inclusive meaning, i.e., "included, but not limited to". In the description of the specification, terms such as "one embodiment", "some embodiments", "exemplary embodiments", "example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner. Terms such as "first" and "second" are only used for descriptive purposes and are not to be construed as indicating or implying the relative importance or implicitly indicating the number of indicated technical features below.

When a temporal relationship is described, for example, when a chronological order is described as "after", "subsequent", "next" "before" or suchlike, non-continuous cases may be included unless "exactly" or "direct" is used.

As used herein, "approximately" includes the stated value and the average value within a range of acceptable deviations from a particular value. The range of acceptable deviations is determined by one of ordinary skill in the art in view of measurement in question and errors associated with measurement of a particular quantity (i.e., limitations of a measurement system).

Some embodiments of the present disclosure provide a display device. The display device may be a large display device such as a television or a monitor, or a small or medium display device such as a tablet computer, a car navigation unit, a game console or a smart watch. In addition, the display device is, for example, a rigid display device. For another example, the display device is a flexible display device.

Referring to FIG. 1, the display device includes a driving substrate 1 and a plurality of light-emitting diodes 2 disposed on the driving substrate 1. The driving substrate 1 is, for example, a printed circuit board (PCB) or a glass-based driving backplane. The light-emitting diode 2 is, for example, a micro light-emitting diode (Micro-LED), and the display device is a Micro-LED display device. For another example, the light-emitting diode 2 is a mini light-emitting diode (Mini-LED), and the display device is a Mini-LED display device.

As shown in FIG. 1, the driving substrate 1 includes a base substrate 11. In some examples, the base substrate 11 is a resin substrate provided with the PCB. In some other examples, the base substrate 11 is a glass substrate with driving circuits or signal lines thereon. That is, the base substrate 11 includes a glass substrate and driving circuits or signal lines on the glass substrate.

The base substrate 11 has a display region A (also referred as an active area (AA)) and a peripheral region S disposed on at least one side of the display region A. For example, as shown in FIG. 1, the display region A has a quadrilateral shape (e.g., a rectangular shape), and the peripheral region S surrounds the display region A. However, a shape of the display region A and a shape of the peripheral region S are not limited thereto, and they may be modified according to actual needs.

The plurality of light-emitting diodes 2 are disposed in the display region A. For example, the plurality of light-emitting diodes 2 are arranged in an array. Of course, the plurality of light-emitting diodes 2 may be arranged in other manners, which can be set according to actual requirements. The plurality of light-emitting diodes 2 include, for example, red light-emitting diodes, blue light-emitting diodes and green light-emitting diodes.

Figure 2:
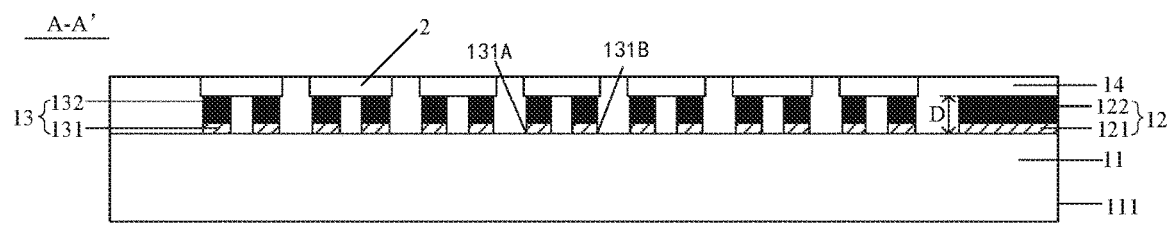
FIG. 2 is a schematic cross-sectional diagram of the light-emitting diode display device along the A-A' line in FIG. 1, in accordance with some embodiments.

The peripheral region S is used for wiring. As shown in FIGS. 1 and 2, the peripheral region S includes a bonding region F between the display region A and a first side face 111 of the base substrate 11.

Figure 3:
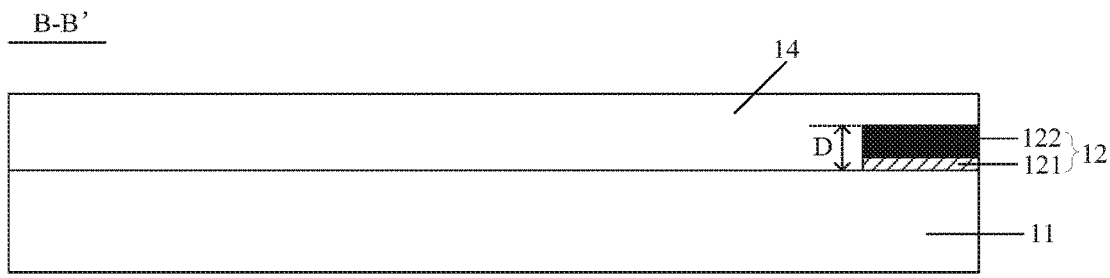
FIG. 3 is a schematic cross-sectional diagram of the light-emitting diode display device along the B-B' line in FIG. 1, in accordance with some embodiments.

As shown in FIGS. 1 to 3, the driving substrate 1 further includes a plurality of first pads 12 spaced apart from each other in the bonding region F on the base substrate 11. A first side face 120 of each first pad 12 is flush with the first side face 111 of the base substrate 11. A thickness of the first pad 12 is in a range from approximately 0.5 microns to approximately 2 microns, such as 0.5 microns, 0.6 microns, 0.7 microns, 0.8 microns, 0.9 microns, 1.0 microns, 1.1 microns, 1.2 microns, 1.3 microns, 1.4 microns, 1.5 microns, 1.6 microns, 1.7 microns, 1.8 microns, 1.9 microns or 2.0 microns.

The thickness of the first pad 12 refers to a dimension of the first pad 12 in a thickness direction of the base substrate 11, for example, the vertical direction in FIG. 2.

The plurality of first pads 12 are arranged along the first side face 111 of the base substrate 11. The first pads 12 are, for example, gold fingers for bonding a driving circuit (e.g., a driving integrated circuit (IC)).

Since the first side face 120 of each first pad 12 is flush with the first side face 111 of the base substrate 11, side traces for connecting the first pads 12 and the driving circuit may be formed on a side face of the driving substrate 1, thereby realizing an ultra-narrow bezel.

In addition, in the related art, since the thickness of the first pad 12 is relatively small, problems such as breakage of the first pad 12 and the first pad 12 being wrapped by protective adhesive may occur during edge grinding, and thus a contact area between the side trace and the first pad 12 is too small. However, in the embodiments of the present disclosure, the thickness D of the first pad 12 is in a range from approximately 0.5 microns to approximately 2 microns, that is, the thickness D of the first pad 12 is relatively large, so that risks of breakage of the first pad 12 and the first pad 12 being wrapped by protective adhesive during edge grinding may be reduced, and the contact area between the side trace and the first pad 12 may be effectively increased to reduce impedance, and thus the stability and the yield of the driving substrate 1 may be improved.

In some embodiments, as shown in FIG. 2, the driving substrate 1 further includes a plurality of second pads 13 disposed in the display region A on the base substrate 11. As shown in FIGS. 1 and 2, the display region A includes a plurality of sub-pixel regions P. The plurality of second pads 13 are disposed in the plurality of sub-pixel regions P in one-to-one correspondence, and the plurality of light-emitting diodes 2 are disposed in the plurality of sub-pixel regions P in one-to-one correspondence. In a sub-pixel region, a second pad 13 is electrically connected to a light-emitting diode 2.

It will be noted that, the second pad 13 may be further electrically connected to a driving thin film transistor in the driving circuit and a common electrode line in the signal lines of the base substrate 11, so as to control the light-emitting diode 2 to emit light. Of course, the connection between the second pad 13 and the base substrate 11 is not limited thereto, and can be set according to actual needs.

In some examples, as shown in FIG. 2, the second pad 13 includes a first sub-layer 131 and a second sub-layer 132. The first sub-layer 131 is more proximate to the base substrate 11 than the second sub-layer 132. A material of the second sub-layer 132 is, for example, solder.

As shown in FIGS. 2 and 6, the first sub-layer 131 includes, for example, a first electrode 131A and a second electrode 131B, and the first electrode 131A and the second electrode 131B are spaced apart. The second sub-layer 132 includes a portion that is disposed on a surface of the first electrode 131A facing away from the base substrate 11 and a portion disposed on a surface of the second electrode 131B facing away from the base substrate 11. Thereby, the light-emitting diode 2 is electrically connected to the first electrode 131A and the second electrode 131B through the solder.

A material of the first sub-layer 131 is, for example, a metal material such as copper. For another example, the material of the first sub-layer 131 includes aluminum (Al), gold (Au) or tungsten (W), or includes any elemental or compound material and groups thereof that is electrically conductive and compatible with the employed process flow, as known to those of ordinary skill in the art.

In some embodiments, as shown in FIG. 2, the first pad 12 includes a third sub-layer 121 and a fourth sub-layer 122. The third sub-layer 121 is more proximate to the base substrate 11 than the fourth sub-layer 122. The third sub-layer 121 and the first sub-layer 131 are disposed in a same layer, and the fourth sub-layer 122 and the second sub-layer 132 are disposed in a same layer.

In some embodiments, a steel mesh used when the solder is brushed onto the first sub-layers 131 of the second pads 13 includes openings corresponding to the third sub-layers 121 of the first pads 12. Therefore, when the first sub-layers 131 are brushed with the solder by using the steel mesh, the third sub-layers 121 are brushed with the solder simultaneously.

In some examples, a material of the fourth sub-layer 122 is the same as a material of the second sub-layer 132. For example, the material of the fourth sub-layer 122 and the material of the second sub-layer 132 are both solder paste. In some other examples, the material of the fourth sub-layer 122 is different from the material of the second sub-layer 132. For example, the material of the fourth sub-layer 122 is other metal materials or conductive adhesive.

In some examples, a material of the third sub-layer 121 is the same as a material of the first sub-layer 131. Of course, the material of the third sub-layer 121 may also be other conductive materials.

In some embodiments, as shown in FIGS. 2 and 3, the driving substrate 1 further includes a protective adhesive layer 14 disposed at a side of the first pads 12 and the second pads 13 away from the base substrate 11. The protective adhesive layer 14 includes via holes each for exposing a surface of a corresponding first pad 12 facing away from the base substrate 11, and each light-emitting diode 2 is disposed in a respective one of the via holes and is electrically connected to a corresponding first pad 12. A side face of the protective adhesive layer 14 is flush with the first side face 111 of the base substrate 11. A hardness of the protective adhesive layer 14 is in a range from approximately 70 Shore D to approximately 90 Shore D, such as 70 Shore D, 75 Shore D, 80 Shore D, 85 Shore D or 90 Shore D.

Shore hardness is used to measure a hardness of a non-metallic material such as plastic, rubber or glass, and a unit of the Shore hardness is HA, HO and HD. A measuring instrument of the Shore hardness is a Shore durometer, which is mainly divided into three types: type A, type C and type D. The type D is suitable for general hard rubber, resin, acrylic, glass, thermoplastic rubber, printing plates, fibers, etc. The Shore durometer is generally used to measure a Shore hardness of a test object. A pointer on a dial plate of the Shore durometer is connected to a puncture needle through a spring. A surface of the test object is pierced by the needle, and a value displayed on the dial plate is a hardness value of the test object. A unit of a value measured by the Shore durometer is "degree", and the description method thereof is divided into two types, A and D. A degree measured by the Shore durometer is xx shore D. In the embodiments of the present disclosure, the hardness of the protective adhesive layer 14 measured by the Shore durometer is in a range from 70 Shore D to 90 Shaw D.

Since the hardness of the protective adhesive layer 14 is in a range from approximately 70 Shore D to approximately 90 Shore D, the defect of breakage of the first pad 12 during edge grinding may be avoided.

In some examples, a material of the protective adhesive layer 14 is a resin material, for example, a black resin material. Therefore, the protective adhesive layer 14 may also play a role in anti-reflection and improving light extraction efficiency.

In some embodiments, as shown in FIG. 4, the driving substrate 1 further includes side traces 15, each of which is disposed on and in direct contact with a respective one of the first side faces 120 of the first pads 12 and a respective one of the first side faces 111 of the base substrates 11.

In some embodiments, the side traces are formed by a transfer printing process. The transfer printing process is a printing method capable of printing characters, graphics and the like on a surface of an irregularly special-shaped object.

It will be noted that, in the embodiments of the present disclosure, by increasing the thickness of the first pad 12, the contact area between the side trace and the first pad 12 may be increased to avoid poor transfer printing.

In some embodiments, as shown in FIG. 4, a vertex angle between the first side face of the base substrate 11 and a surface of the base substrate 11 facing away from the first pad 12 is a chamfer.

In some embodiments, as shown in FIG. 4, the side trace 15 extends from the first side of the first pad 12 to the surface of the base substrate 11 facing away from the first pad 12.

By chamfering the vertex angle between the first side face of the base substrate 11 and the surface of the base substrate 11 facing away from the first pad 12, integrity of the side trace 15 may be ensured when the side trace 15 is formed by transfer printing process. Moreover, the probability that the side trace 15 is open circuit may also be reduced.

Some embodiments of the present disclosure provide a manufacturing method of a driving substrate, and the driving substrate is any one of the driving substrates described in the above embodiments. The manufacturing method, referring to FIG. 5, includes S1 to S3.

Figure 7:
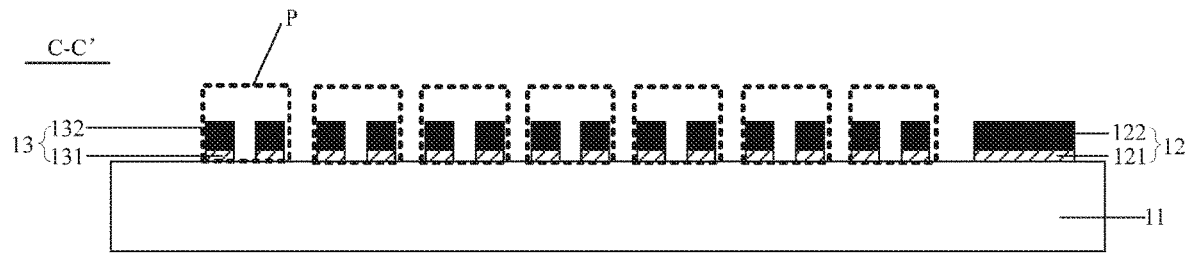
FIG. 7 is a schematic cross-sectional diagram of the driving substrate along the C-C' line in FIG. 6, in accordance with some embodiments.
Figure 8:
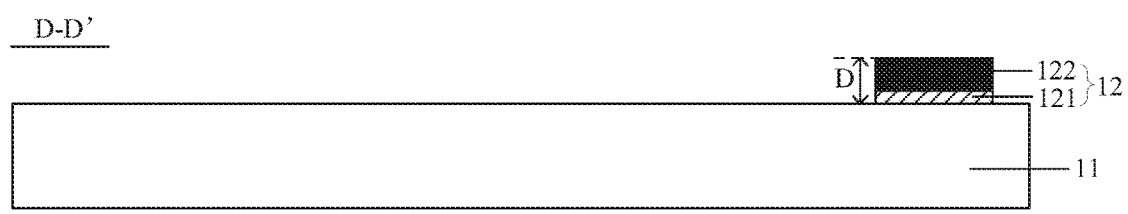
FIG. 8 is a schematic cross-sectional diagram of the driving substrate along the D-D' line in FIG. 6, in accordance with some embodiments.
Figure 9:
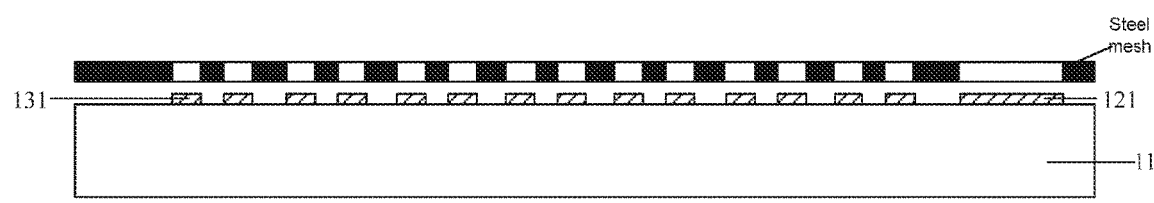
FIG. 9 is a schematic diagram showing how to brush solder on a first sub-layer, in accordance with some embodiments.

In S1, as shown in FIGS. 6, 7 and 8, a plurality of first pads 12 spaced apart from each other are formed in the bonding region F on the base substrate 11. The thickness of the first pad 12 is in a range from approximately 0.5 microns to approximately 2 microns.

In S2, as shown in FIGS. 2 and 3, a first side of the driving substrate 1 is edge-grinded, so that a first side face 120 of each first pad 12 is flush with the first side face 111 of the base substrate 11.

Beneficial technical effects of the manufacturing method of the driving substrate provided by the embodiments of the present disclosure are the same as beneficial technical effects of the driving substrate provided by the embodiments of the present disclosure, and details are not described herein again.

In some embodiments, as shown in FIG. 7, the manufacturing method further includes forming the second pads 13 in the display region A on the base substrate 11.

In some embodiments, forming the first pads 12 and forming the second pads 13, include: forming, by a first patterning process, third sub-layers 121 of the first pads 12 in the bonding region F and first sub-layers 131 of the second pads 13 in the display region A on the base substrate 11; and forming, by a second patterning process, seconds sub-layer 132 of the second pads 13 on the first sub-layers 131, and fourth sub-layers 122 of the first pads 12 on the third sub-layers 121.

The first patterning process includes, for example, depositing a conductive layer by a deposition process, patterning the conductive layer by a photolithography process, and an etching process to form the third sub-layer 121 of the first pad 12 in the bonding region F and the first sub-layer 131 of the second pad 13 in the display region A. Herein, the conductive layer is made of a metal such as copper.

The second patterning process includes, for example, attaching a steel mesh having openings at positions corresponding to the third sub-layers 121 and positions corresponding to the first sub-layers 131 to the base substrate 11 on which the third sub-layers 121 and the first sub-layers 131 have been formed, and then brushing solder paste at the openings to form the second sub-layers 132 of the second pads 13 and the fourth sub-layers 122 of the first pads 12 simultaneously.

Of course, in the above steps, other conductive materials, such as other metal materials or conductive adhesive may be brushed at the opening of the the steel mesh corresponding to the third sub-layer 121 to form the fourth sub-layer 122.

Figure 10:
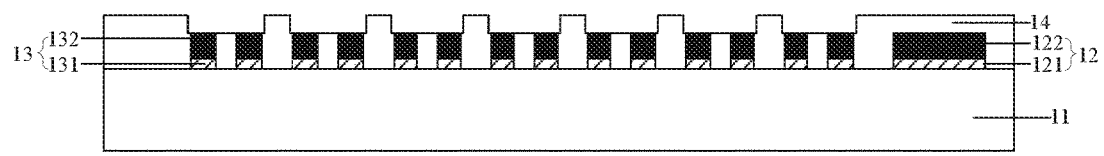
FIG. 10 is a schematic diagram of a structure in which a protective adhesive layer is formed on the basis of FIG. 7, in accordance with some embodiments.
Figure 11:
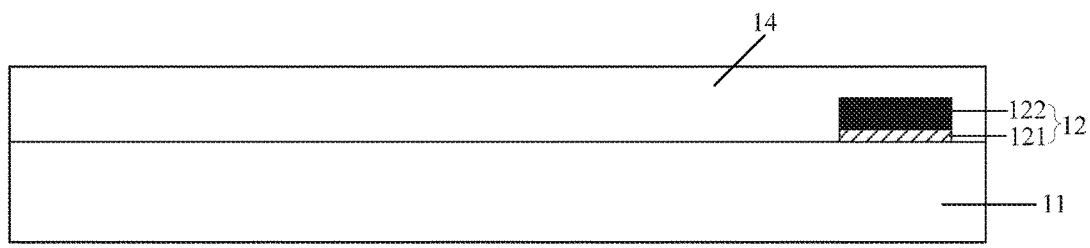
FIG. 11 is a schematic diagram of a structure in which a protective adhesive layer is formed on the basis of FIG. 8, in accordance with some embodiments.

In some embodiments, the manufacturing method further includes: as shown in FIGS. 10 and 11, forming the protective adhesive layer 14 on the first pads 12 and the second pads 13. The protective adhesive layer 14 includes via holes for exposing surfaces of the second pads 13 facing away from the base substrate 11, and a hardness of the protective adhesive layer 14 is in a range from 70 Shore D to 90 Shore D. This step may be performed before the first side of the driving substrate 1 is processed, but the embodiments of the present disclosure are not limited thereto.

For example, the protective adhesive layer 14 is formed by the following method. An adhesive layer is deposited on the first pads 12 and the second pads 13, and via holes are formed at positions corresponding to the first pads 12 by a patterning process. The patterning process includes, for example, a photolithography process, or a process including a photolithography process and an etching process. The photolithography process refers to a process that includes film formation (e.g., chemical vapor deposition (CVD) film formation), exposure, development, and the like, and forms a pattern by using a photoresist, a mask plate, and an exposure machine, and the like.

In the embodiments of the present disclosure, on the one hand, by forming the protective adhesive layer 14 at a side of the first pads 12 and the second pads 13 away from the base substrate, circuit wirings on the base substrate 11 may be protected; on the other hand, by setting the hardness of the protective adhesive layer 14 to the above range, the breakage of the first pad may also be prevented during edge grinding.

Figure 12:
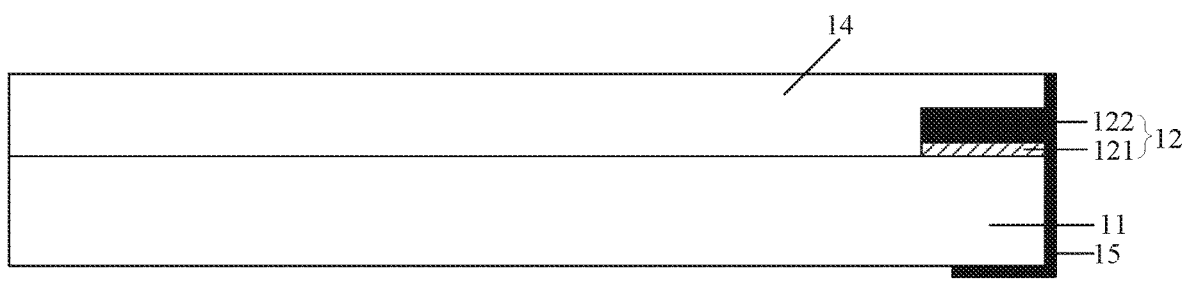
FIG. 12 is a schematic diagram of a structure in which a side trace is formed on the basis of FIG. 11, in accordance with some embodiments.

In some embodiments, the manufacturing method further includes: as shown in FIG. 12, forming a side trace 15 on a side face of the driving substrate 1 by a transfer printing process, so that the side trace 15 is in direct contact with the first side face 120 of the first pad 12. For example, the side trace 15 is formed on both the first side face 111 of the base substrate 11 and the first side face 120 of the first pad 12 by a transfer printing process. For another example, the side trace 15 is formed on all of the first side face 111 of the base substrate 11, the first side face 120 of the first pad 12 and a corresponding side face of the protective adhesive layer 14 by a transfer printing process. The side trace 15 may extend to a surface of the base substrate 11 facing away from the first pad 12.

Figure 13:
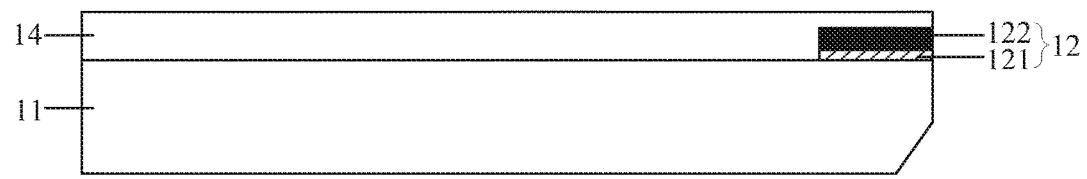
FIG. 13 is a schematic diagram of a structure in which a chamfering process is performed on the basis of FIG. 11, in accordance with some embodiments.

In some embodiments, before the side traces 15 are formed on the first side face of the driving substrate 1 by the transfer printing process, the manufacturing method further includes: as shown in FIG. 13, chamfering the vertex angle between the first side face of the base substrate 11 and the surface of the base substrate 11 facing away from the first pad 12.

In this way, manufacturing the side trace 15 by transfer printing is beneficial to ensure integrity of the side trace 15. Moreover, the probability that the side trace 15 is open circuit may also be reduced after chamfering the vertex angle.

It will be noted that execution sequence of the steps is not limited in the above embodiments, and the above sequence can be adjusted according to actual needs by those skilled in the art.

The protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A driving substrate, comprising:
a base substrate having a display region and a peripheral region, wherein the peripheral region includes a bonding region disposed between the display region and a first side face of the base substrate; and
a plurality of first pads spaced apart from each other in the bonding region on the base substrate, wherein a first side face of each first pad is flush with the first side face of the base substrate, and a thickness of the first pad is in a range from approximately 0.5 microns to approximately 2 microns; a plurality of second pads disposed in the display region on the base substrate, wherein at least one second pad of the plurality of second pads includes a first sub-layer and a second sub-layer that are stacked in a direction away from the base substrate, and a material of the second sub-layer is solder; wherein at least one first pad of the plurality of first pads includes a third sub-layer and a fourth sub-layer that are stacked, wherein the third sub-layer and the first sub-layer are disposed in a same layer, and the fourth sub-layer and the second sub-layer are disposed in a same layer.

2. The driving substrate according to claim 1, further comprising a protective adhesive layer disposed at a side of the plurality of first pads and the plurality of second pads away from the base substrate, wherein the protective adhesive layer includes via holes each for exposing a surface of a respective one of the plurality of first pads facing away from the base substrate, a side face of the protective adhesive layer is flush with the first side face of the base substrate, and a hardness of the protective adhesive layer is in a range from approximately 70 Shore D to approximately 90 Shore D.

3. The driving substrate according to claim 1, further comprising a side trace disposed on and in contact with both the first side face of the first pad and the first side face of the base substrate.

4. The driving substrate according to claim 3, wherein a vertex angle between the first side face of the base substrate and a surface of the base substrate facing away from the first pad is a chamfer.

5. A display device, comprising:
the driving substrate according to claim 1; and
a plurality of light-emitting diodes disposed in the display region on the driving substrate.

6. A manufacturing method of the driving substrate according to claim 1, the manufacturing method comprising:
edge-grinding a side of the driving substrate formed with the plurality of first pads so that the first side face of each first pad is flush with the first side face of the base substrate.

7. The manufacturing method according to claim 6, further comprising:
forming the plurality of second pads in the display region on the base substrate.

8. The manufacturing method according to claim 7, wherein forming the plurality of first pads and the plurality of second pads, includes:
forming first sub-layers of the plurality of second pads and third sub-layers of the plurality of first pads by a first patterning process; and
forming second sub-layers of the plurality of second pads and fourth sub-layers of the plurality of first pads by a second patterning process.

9. The manufacturing method according to claim 8, further comprising:
forming a protective adhesive layer at a side of the plurality of first pads and the plurality of second pads away from the base substrate, wherein the protective adhesive layer includes via holes each for exposing a surface of a respective one of the plurality of second pads facing away from the base, and a hardness of the protective adhesive layer is in a range from approximately 70 Shore D to approximately 90 Shore D.

10. The manufacturing method according to claim 6, further comprising:
forming a side trace on both the first side face of the base substrate and the side face of the first pad by a transfer printing process.

11. The manufacturing method according to claim 10, wherein before forming a side trace on both the first side face of the base substrate and the side face of the first pad by a transfer printing process, the manufacturing method further comprises:
chamfering a vertex angle between the first side face of the base substrate and a surface of the base substrate facing away from the first pad.

* * * * *